United States Patent
Kang (10) Patent No.: US 8,461,859 B2
(45) Date of Patent: Jun. 11, 2013

(54) SEMICONDUCTOR DEVICE AND INTERFACE BOARD FOR TESTING THE SAME

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 909 days.

(21) Appl. No.: 12/495,143

(22) Filed: Jun. 30, 2009

(65) Prior Publication Data

US 2010/0244854 A1    Sep. 30, 2010

(30) Foreign Application Priority Data

Mar. 30, 2009  (KR) .................. 10-2009-0026914

(51) Int. Cl.
*G01R 31/26* (2006.01)

(52) U.S. Cl.
USPC ............. 324/762.01; 324/762.03; 324/760.01

(58) Field of Classification Search
None
See application file for complete search history.

(56) References Cited

U.S. PATENT DOCUMENTS

| 6,898,745 | B2 | 5/2005 | Zanardi et al. |
| 7,315,483 | B2 * | 1/2008 | Jang ........................... 365/226 |
| 7,684,269 | B2 * | 3/2010 | Kang .......................... 365/201 |
| 2009/0003088 | A1 | 1/2009 | Kang |

FOREIGN PATENT DOCUMENTS

| JP | 2004-178724 | 6/2004 |
| JP | 2007-147617 | 6/2007 |
| KR | 1020010019753 | 3/2001 |
| KR | 1020050000010 | 1/2005 |
| KR | 1020080095681 | 10/2008 |

OTHER PUBLICATIONS

Notice of Allowance issued from Korean Intellectual Property Office on Aug. 30, 2011.
Notice of Preliminary Rejection issued from Korean Intellectual Property Office on Jan. 19, 2011.

\* cited by examiner

*Primary Examiner* — Melissa Koval
*Assistant Examiner* — Trung Nguyen
(74) *Attorney, Agent, or Firm* — IP & T Group LLP

(57) ABSTRACT

A semiconductor device includes a common probing pad; an internal voltage generation unit having a plurality of internal voltage generation blocks configured to generate a plurality of internal voltages; and a probing voltage selection unit configured to transfer an internal voltage selected from the internal voltages to the common probing pad in response to a plurality of voltage selection signals.

17 Claims, 6 Drawing Sheets

SEMICONDUCTOR DEVICE AND INTERFACE BOARD FOR TESTING THE SAME

CROSS-REFERENCE TO RELATED APPLICATIONS

The present application claims priority of Korean patent application number 10-2009-0026914, filed on Mar. 30, 2009, the disclosure of which is incorporated by reference in its entirety.

BACKGROUND OF THE INVENTION

The present invention relates to a semiconductor device design and a test technique, and more particularly, to a semiconductor device and an interface board for testing the semiconductor device to improve a test efficiency.

A semiconductor device is fabricated through design, process and test steps. It is important to reduce the fabrication time and costs in performing the manufacturing steps.

Recently, as semiconductor devices are desired to have high speed and high integrated characteristics, the fabrication time and processing costs are increased in the design and process steps. Particularly, it is desired to perform various tests because the semiconductor device may have an internal error.

Figure 1:
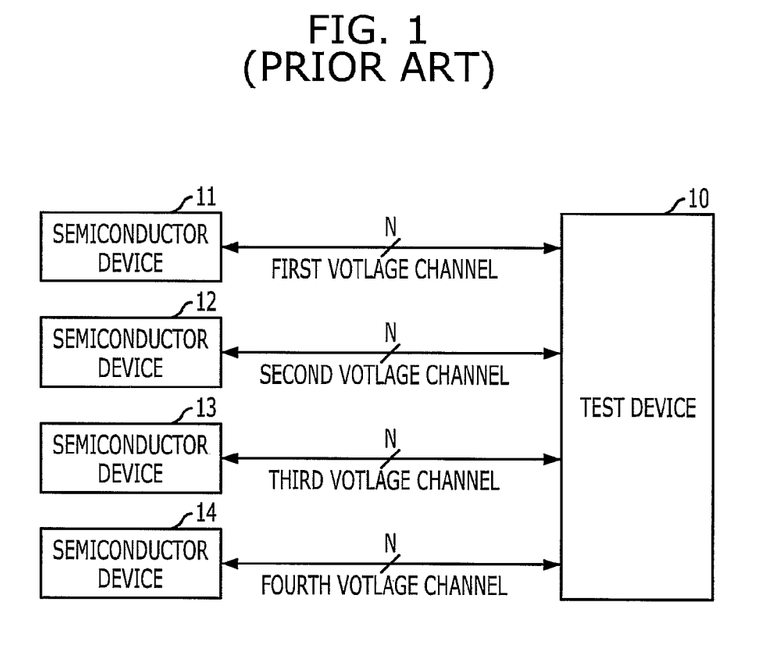
FIG. 1 is a block diagram for illustrating a conventional test circuit for a semiconductor device.

FIG. 1 is a block diagram for illustrating a conventional test circuit for a semiconductor device.

Referring to FIG. 1, the conventional test circuit for the semiconductor device includes a plurality of semiconductor devices 11 to 14 and a test device 10.

The semiconductor devices 11 to 14 are coupled to the test device through a plurality of voltage channels. The semiconductor devices 11 to 14 are allocated to first to fourth channels of the test device 10. N number of voltages are transferred through one voltage channel, where N denotes an integer.

The test device 10 applies a plurality of test voltages to the semiconductor devices 11 to 14 through a respective voltage channel, and probes a plurality of internal voltages outputted from the semiconductor device through the identical voltage channel.

That is, while forcing a plurality of identical tests to a plurality of semiconductor devices 11 to 14, the identical test voltages are transferred through a voltage channel allocated to each of the semiconductor devices 11 to 14. In forcing a plurality of identical tests, a test device detects an error by applying an identical voltage to a semiconductor device. While a plurality of internal voltages outputted from each of the semiconductor devices 11 to 14 are probed, the internal voltages are transferred to each of the semiconductor devices 11 to 14 through the voltage channel allocated to the respective one of the semiconductor devices 11 to 14.

Accordingly, because the voltage channel should be allocated to each of the semiconductor devices and one voltage channel has N voltage transferring interfaces, a large number of voltage transferring interfaces, e.g., channels, are desired to test the semiconductor devices.

Figure 2:
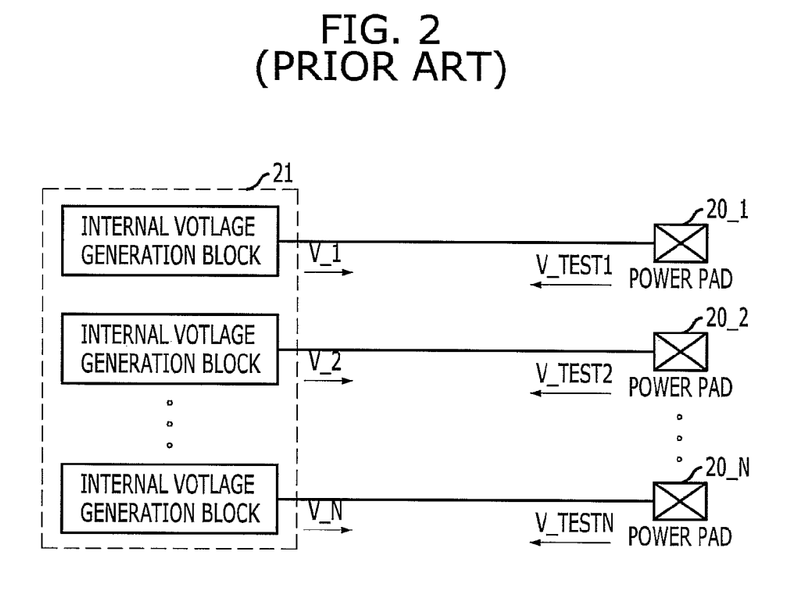
FIG. 2 is a block diagram illustrating a conventional semiconductor device.

FIG. 2 is a block diagram illustrating a conventional semiconductor device.

Referring to FIG. 2, the conventional semiconductor device 21 transfers a plurality of internal voltages V_1 to V_N, which are generated from a plurality of internal voltage generation blocks, externally through a plurality of power pads 20_1 to 20_N, or inputs a plurality of test voltages V_TEST1 to V_TESTN, which are applied through the power pads 20_1 to 20_N, to the internal voltage generation blocks.

That is, because the power pads 20_1 to 20_N are each coupled to a voltage channel of a test device, test processes for measuring the internal voltages of the semiconductor device and for forcing test voltages to the internal voltage generation blocks may be performed through the power pads 20_1 to 20_N.

As described above, a voltage channel should be allocated to each of the semiconductor devices to test the conventional semiconductor devices at the same time.

In general, a test device performs various tests by supplying a power supply and exchanging signals after accessing a plurality of channels, e.g., a power channel, a command channel, a data channel and an address channel, through a pad of the semiconductor devices to be tested.

Accordingly, when the test device tests the conventional semiconductor devices, the number of semiconductor devices, which are tested at the same time, is limited. This increases test time and costs and an improved technology is desired to resolve this problem.

SUMMARY OF THE INVENTION

Exemplary embodiments of the present invention are directed to providing to a semiconductor device and an interface board for testing the semiconductor device to improve a test efficiency.

In accordance with an exemplary feature of the present invention, there is provided a semiconductor device including a common probing pad; an internal voltage generation unit having a plurality of internal voltage generation blocks configured to generate a plurality of internal voltages; and a probing voltage selection unit configured to transfer an internal voltage selected from the internal voltages to the common probing pad in response to a plurality of voltage selection signals.

The semiconductor device may further include a plurality of power pads configured to receive a plurality of test voltages provided from a test device; and a forcing-voltage selection unit configured to perform forcing of the test voltages, which are applied to the power pads, to the internal voltage generation blocks in response to the voltage selection signals.

The semiconductor device may further include a test control unit configured to generate the voltage selection signals, wherein a same one of the voltage selection signals is configured to be used to control a selective application of one of test voltages provided from a test device to one of the plurality of internal voltage generation blocks and to control a transfer of the internal voltage of the internal voltage generation block to the common probing pad.

The internal voltage generation blocks, respectively, may include reference voltage generators configured to generate internal reference voltages and internal voltage generators configured to generate internal voltages corresponding to voltage levels of the internal reference voltages.

The internal voltages may be the internal reference voltages generated from the reference voltage generators.

The internal voltages may be the internal voltages generated from the internal voltage generators.

The semiconductor device may further include a test control unit configured to generate the voltage selection signals.

The internal voltage generation blocks, respectively, may include reference voltage generators configured to generate internal reference voltages and internal voltage generators configured to generate internal voltages corresponding to voltage levels of the internal reference voltage.

The forcing-voltage selection unit may perform forcing the test voltages to the reference voltage generators.

The test voltages may be commonly provided to the semiconductor devices through a common voltage channel of the test device.

The probing voltage selection unit may include a plurality of switches configured to output an internal voltage selected from the internal voltages in response to the voltage selection signal.

The probing voltage selection unit may include a plurality of switches configured to output an internal voltage selected from the internal voltages in response to the voltage selection signal.

The switches may be transmission gates.

The forcing-voltage selection unit may include a plurality of switches configured to selectively output the test voltages in response to the voltage selection signal.

In accordance with another aspect of the present invention, there is provided a test interface board including a plurality of common voltage input terminals configured to receive a plurality of test voltages provided through a common voltage channel of a test device; a plurality of test voltage transferring line group configured to be allocated to a plurality of semiconductor devices, respectively, and to each transfer the test voltages, which are applied to the common voltage input terminals, to the respective semiconductor device; and a plurality of voltage transferring pins configured to couple the test voltage transferring line groups to a plurality of power pads of each of the semiconductor devices.

The plurality test voltages may be applied to a plurality of internal voltage generation blocks of each of the semiconductor devices.

Each of the semiconductor devices may include a common probing pad configured to selectively output one of the internal voltages generated from the internal voltage generation blocks.

The common voltage channel may have a plurality of voltage transferring interfaces configured to transfer the test voltages.

Each of the test voltage transferring line groups may have a plurality of transfer lines configured to transfer the test voltages.

DESCRIPTION OF SPECIFIC EMBODIMENTS

Other objects and advantages of the present invention can be understood by the following description, and become apparent with reference to the embodiments of the present invention.

Figure 3:
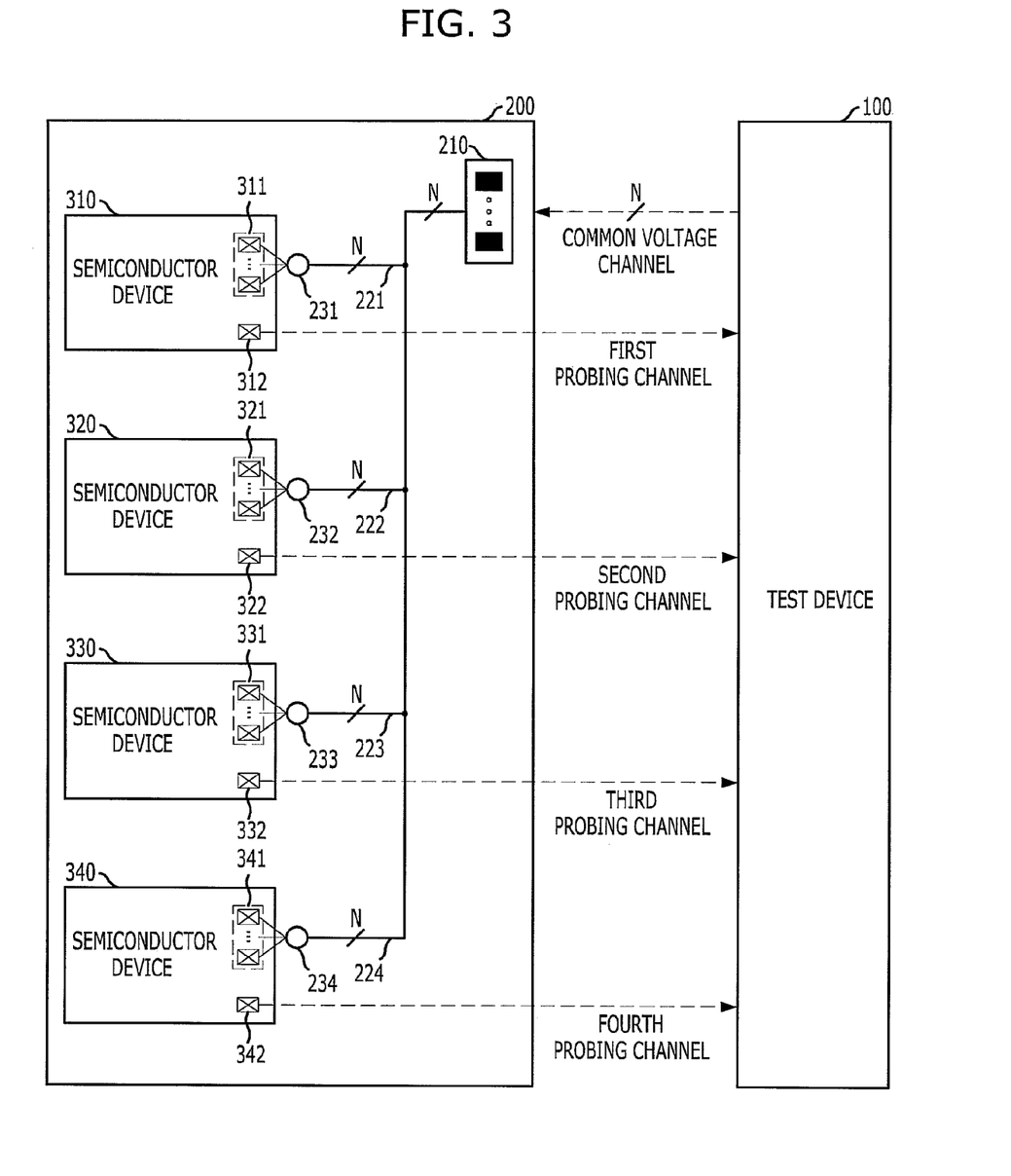
FIG. 3 is a block diagram for illustrating a test circuit for a semiconductor device in accordance with an embodiment of the present invention.

FIG. 3 is a block diagram for illustrating a test circuit for a semiconductor device in accordance with an embodiment of the present invention.

Referring to FIG. 3, a test interface board 200 includes a plurality of common voltage input terminals 210, a plurality of test voltage transferring line groups 221, 222, 223 and 224, and a plurality of voltage transferring pins 231, 232, 233 and 234.

The common voltage input terminals 210 receive a plurality of test voltages provided through a common voltage channel of a test device 100. The test voltage transferring line groups 221, 222, 223 and 224 are allocated to each of a plurality of semiconductor devices 310, 320, 330 and 340, and transfer the test voltages applied to the common voltage input terminals 210 to the semiconductor devices 310, 320, 330 and 340. The voltage transferring pins 231, 232, 233 and 234 couple a plurality of power pads 311, 321, 331 and 341 included in each of the semiconductor devices 310, 320, 330 and 340 to the test voltage transferring line groups 221, 222, 223 and 224 allocated.

For illustration purposes, the test voltages are voltages which are applied to a plurality of internal voltage generation blocks of each of the semiconductor devices 310, 320, 330 and 340. The semiconductor devices 310, 320, 330 and 340 have common probing pads 312, 322, 332 and 342 for selectively outputting one of the internal voltages generated from the internal voltage generation blocks.

Hereinafter, operations of the test interface board 200, the semiconductor devices 310, 320, 330 and 340, and the test device 100 will be described below in details.

The test device 100 tests a plurality of identical semiconductor devices 310, 320, 330 and 340 at the same time. That is, the test device 100 performs various tests using a power supply and performs a signal exchange after accessing a plurality of channels, e.g., a power channel, a command channel, a data channel, and an address channel, through a pad of the semiconductor devices 310, 320, 330 and 340 to be tested.

Firstly, if a test for forcing a plurality of identical tests voltages to the semiconductor devices 310, 320, 330 and 340 is performed, the test device 100 applies the plurality of identical test voltages to the common voltage input terminals 210 of the test interface board through a common voltage channel. For illustration purposes, the common voltage channel has N voltage transferring interfaces for transferring N test voltages, and N common voltage input terminals are desired to receive N test voltages, where N is a natural number.

The test voltage transferring line groups 221, 222, 223 and 224 of the test interface board 200 are allocated to each of the semiconductor devices 310, 320, 330 and 340, and transfer the test voltages applied to the common voltage input terminals 210 to the semiconductor devices 310, 320, 330 and 340. N test voltage transferring line groups are desired to transfer N test voltages.

Each of the semiconductor devices 310, 320, 330 and 340 has a plurality of power pads 311, 321, 331 and 341. The voltage transferring pins 231, 232, 233 and 234 of the test interface board 200 couple the power pads 311, 321, 331 and 341 to the test voltage transferring line groups allocated to the semiconductor devices 310, 320, 330 and 340.

That is, if identical test voltages are applied to the semiconductor devices 310, 320, 330 and 340 using the test interface board 200, the number of channels that are used may be reduced by providing the identical test voltages to the semiconductor devices 310, 320, 330 and 340 through the common voltage channel of the test device 100.

Accordingly, the more the number of channels that are used is reduced, the more the semiconductor devices may be tested.

Next, if a test for probing a plurality of internal voltages outputted from the semiconductor devices 310, 320, 330 and 340 is performed, the test device 100 allocates probing channels to each of the semiconductor devices 310, 320, 330 and 340, and measures an internal voltage outputted from the common probing pads 312, 322, 332 and 342 of the semiconductor devices 310, 320, 330 and 340.

For illustration purposes, the semiconductor devices 310, 320, 330 and 340 in accordance with an embodiment of the present invention have the internal voltage generation blocks for generating a plurality of internal voltages.

The semiconductor devices 310, 320, 330 and 340 selectively output one of the internal voltages through the common probing pads 312, 322, 332 and 342 without outputting the internal voltages through the pads at the same time.

Accordingly, the test device 100 allocates one probing channel to each of semiconductor devices 310, 320, 330 and 340 and measures the internal voltage outputted from the common probing pads. Because, the test device 100 measures the internal voltages through one probing channel, that is, the internal voltages may be sequentially outputted, the number of channels that are used for a test is reduced.

Figure 4:
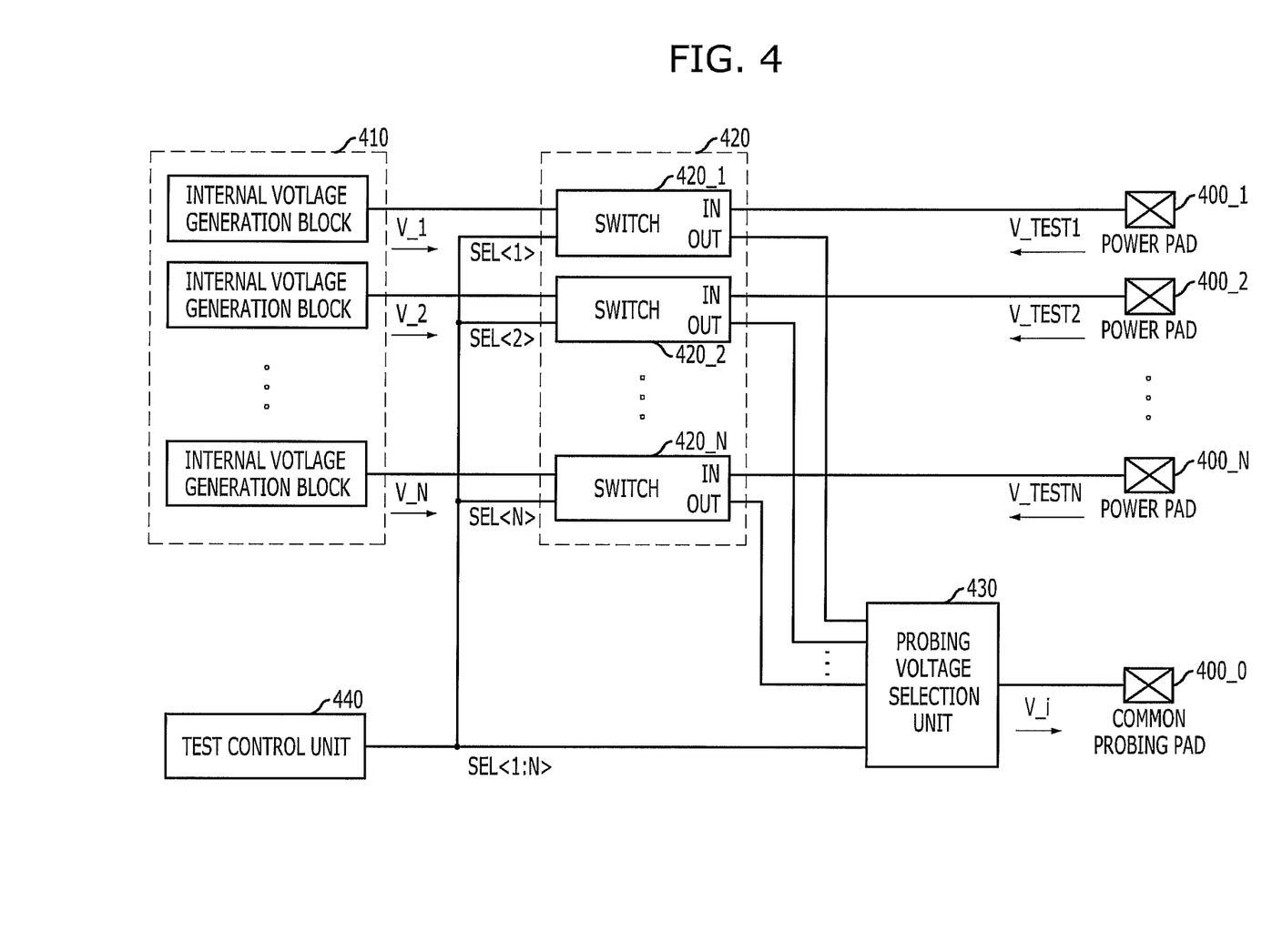
FIG. 4 is a block diagram illustrating a semiconductor device shown in FIG. 3 in accordance with an embodiment of the present invention.

FIG. 4 is a block diagram illustrating a semiconductor device shown in FIG. 3 in accordance with an embodiment of the present invention.

Referring to FIG. 4, the semiconductor device includes a common probing pad 400_0, an internal voltage generation unit 410 and a probing voltage selection unit 430.

The internal voltage generation unit 410 having a plurality of internal voltage generation blocks generates a plurality of internal voltages V_1 to V_N. The proving voltage selection unit 430 transfers the internal voltage selected from the internal voltages V_1 to V_N to the common probing pad 400_0 in response to a plurality of voltage selection signals SEL<1:N>.

The semiconductor device may further include a plurality of power pads 400_1 to 400_N, a forcing-voltage selection unit 420, and a test control unit 440.

The power pads 400_1 to 400_N receive a plurality of test voltages V_TEST1 to V_TESTN provided from the test device 100 of FIG. 3. The forcing-voltage selection unit 420 performs forcing the test voltages V_TEST1 to V_TESTN, which are applied to the power pads 400_1 to 400_N, to the internal voltage generation unit 410 in response to a plurality of voltage selection signals SEL<1:N>.

The test control unit 440 generates the voltage selection signals SEL<1:N>. The test voltages V_TEST1 to V_TESTN are commonly provided to the semiconductor device through a common voltage channel of the test device.

Hereinafter, operation of the semiconductor device will be described below in details.

The forcing-voltage selection unit 420 performs forcing the test voltages V_TEST1 to V_TESTN, which are applied to the power pads 400_1 to 400_N, to the internal voltage generation unit 410 in response to the voltage selection signals SEL<1:N>. The forcing-voltage selection unit 420 has a plurality of switches 420_1 to 420_N for selectively outputting the test voltages V_TEST1 to V_TESTN in response to the voltage selection signals SEL<1:N>.

Since the switches 420_1 to 420_N have the same circuit, one of the switches 420_1 to 420_N will be described as an example in reference to FIG. 5.

Figure 5:
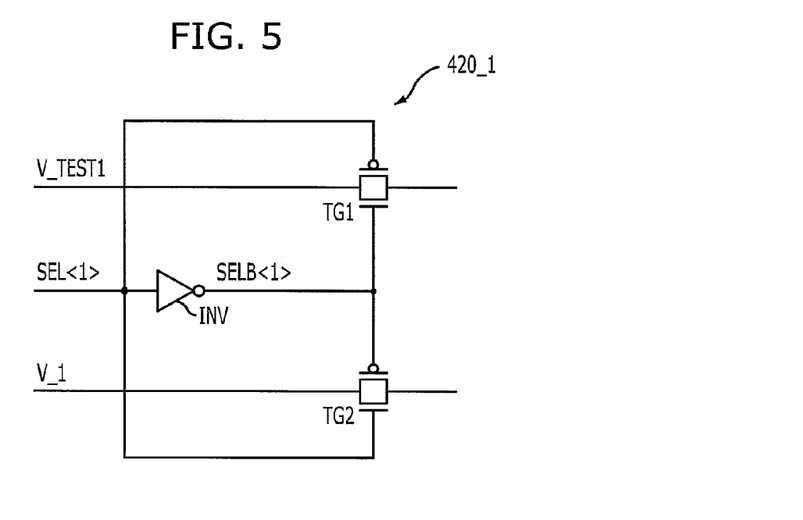
FIG. 5 is a circuit diagram illustrating a switch of the forcing-voltage selection unit shown in FIG. 4.

FIG. 5 is a circuit diagram illustrating a switch of the forcing-voltage selection unit shown in FIG. 4.

Referring to FIGS. 4 and 5, the first switch 420_1 includes an inverter INV, a first transmission gate TG1 and a second transmission gate TG2.

The inverter INV receives a first voltage selection signal SEL<1>.

The first transmission gate TG1 receives the first voltage selection signal SEL<1> and a first test voltage V_TEST1, and is operated in response to the first voltage selection signal SEL<1> and an output signal SELB<1> of the inverter INV.

The second transmission gate TG2 receives the first voltage selection signal SEL<1> and a first internal voltage V_1, and is operated in response to the voltage selection signal SEL<1> and an output signal SELB<1> of the inverter INV.

The first transmission gate TG1 and the second transmission gate TG2 are selectively turned on in response to the first voltage selection signal SEL<1>.

If the first voltage selection signal SEL<1> is a logic low level, the first transmission gate TG1 is turned on, and performs forcing the first test voltage V_TEST1 to the internal voltage generator.

If the first voltage selection signal SEL<1> is a logic high level, the second transmission gate TG2 is turned on and outputs the first internal voltage V_1.

That is, a plurality of voltage selection signals SEL<1:N> are all logic low levels, the first transmission gates perform forcing the test voltages V_TEST1 to V_TESTN to the internal voltage generation blocks of the internal voltage generation unit 410

The probing voltage selection unit 430 transfers an internal voltage selected from the internal voltages V_1 to V_N to the common probing pad in response to the voltage selection signals SEL<1:N>.

The probing voltage selection unit 430 has a plurality of switches for outputting the internal voltage selected from the internal voltages V_1 to V_N in response to the voltage selection signals SEL<1:N>.

Figure 6:
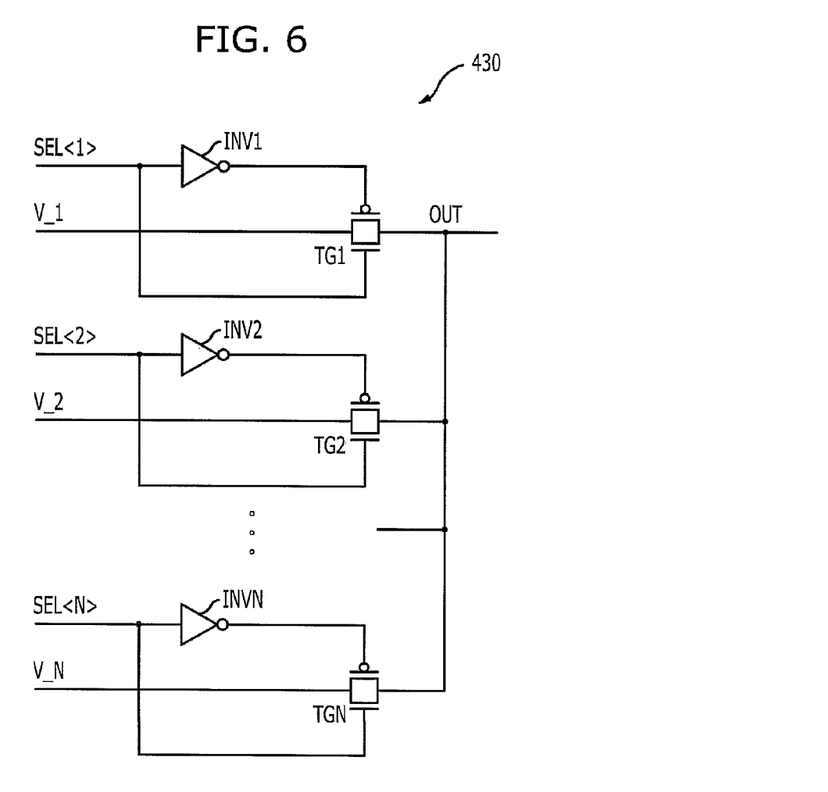
FIG. 6 is a circuit diagram illustrating a probing voltage selection unit shown in FIG. 4.

FIG. 6 is a circuit diagram illustrating a probing voltage selection unit shown in FIG. 4.

Referring to FIGS. 4 and 6, the probing voltage selection unit 430 includes a plurality of inverters INV1 to INVN and a plurality of transmission gates TG1 to TGN.

The inverters INV1 to INVN receive voltage selection signals SEL<1:N>, respectively, and output inverted signals of the voltage selection signals.

The transmission gates TG1 to TGN receive internal voltages V1 to VN and are operated in response to the voltage selection signals SEL<1:N>, respectively. The output signals outputted from the transmission gates TG1 to TGN are transferred to a common output node OUT.

If a first voltage selection signal SEL<1> is a logic high level, and the other voltage selection signals SEL<2:N> are logic low levels, a first internal voltage V_1 is transferred to the common output node OUT.

If a second voltage selection signals SEL<2> is a logic high level, and the other voltage selection signals SEL<1> and SEL<3:N> are logic low levels, a second internal voltage V_2 is transferred to the common output node OUT.

That is, the transmission gate corresponding to the voltage selection signal having a logic high level is turned on and transfers a corresponding internal voltage to the common output node OUT. Because the common output node OUT is coupled to the common probing pad of the semiconductor device, the corresponding internal voltage is outputted through the common probing pad.

In this embodiment of the present invention, the forcing-voltage selection unit 420 and the probing voltage selection unit 430 are configured to be commonly operated in response to the voltage selection signals SEL<1:N>. Accordingly, the internal voltages V_1 to V_N are transferred to the probing voltage selection unit 430 via the forcing-voltage selection unit 420.

That is, if the voltage selection signals SEL<1:N> are all logic low levels, the forcing-voltage selection unit 420 transfers the test voltages V_TEST1 to V_TESTN to the internal voltage generation unit 410, but does not transfer the internal voltages V_1 to V_N generated from the internal voltage generation unit 410 to the probing voltage selection unit 430.

If one of the voltage selection signals SEL<1:N> is a logic high level, the forcing-voltage selection unit 420 transfers the corresponding internal voltage to the probing voltage selection unit 430 in response to the corresponding voltage selection signal.

The forcing-voltage selection unit 420 does not perform forcing the corresponding test voltage to the internal voltage generation unit 410.

According to another example, the forcing-voltage selection unit 420 and the probing voltage selection unit 430 are not coupled to each other and may be controlled by different control signals.

Figure 7:
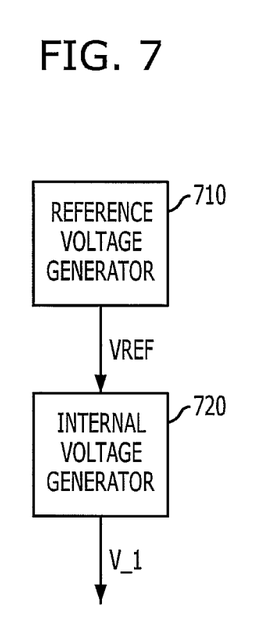
FIG. 7 is a block diagram illustrating an internal voltage generation unit shown in FIG. 4.

FIG. 7 is a block diagram illustrating an internal voltage generation unit shown in FIG. 4.

Referring to FIGS. 4 and 7, the internal voltage generation block includes a reference voltage generator 710 and an internal voltage generator 720.

The reference voltage generator 710 generates an internal reference voltage VREF. The internal voltage generator 720 generates an internal voltage V_1 corresponding to a voltage level of the internal reference voltage VREF.

For illustration purposes, when the semiconductor devices are tested, the semiconductor devices perform forcing the test voltages V_TEST1 to V_TESTN provided from the test device to the reference voltage generator 710 of the internal voltage generation blocks of the semiconductor devices. The internal voltage generator 720 generates the internal voltage corresponding to the test voltages forced to the internal voltage generation block.

In another embodiment of the present invention, a plurality of test voltages may be directly forced/applied to the internal voltage generator.

When the semiconductor devices are tested, the internal voltages generated from the internal voltage generation block are selectively outputted through the common probing pad 400_0, and are measured at the test device.

Figure 8:
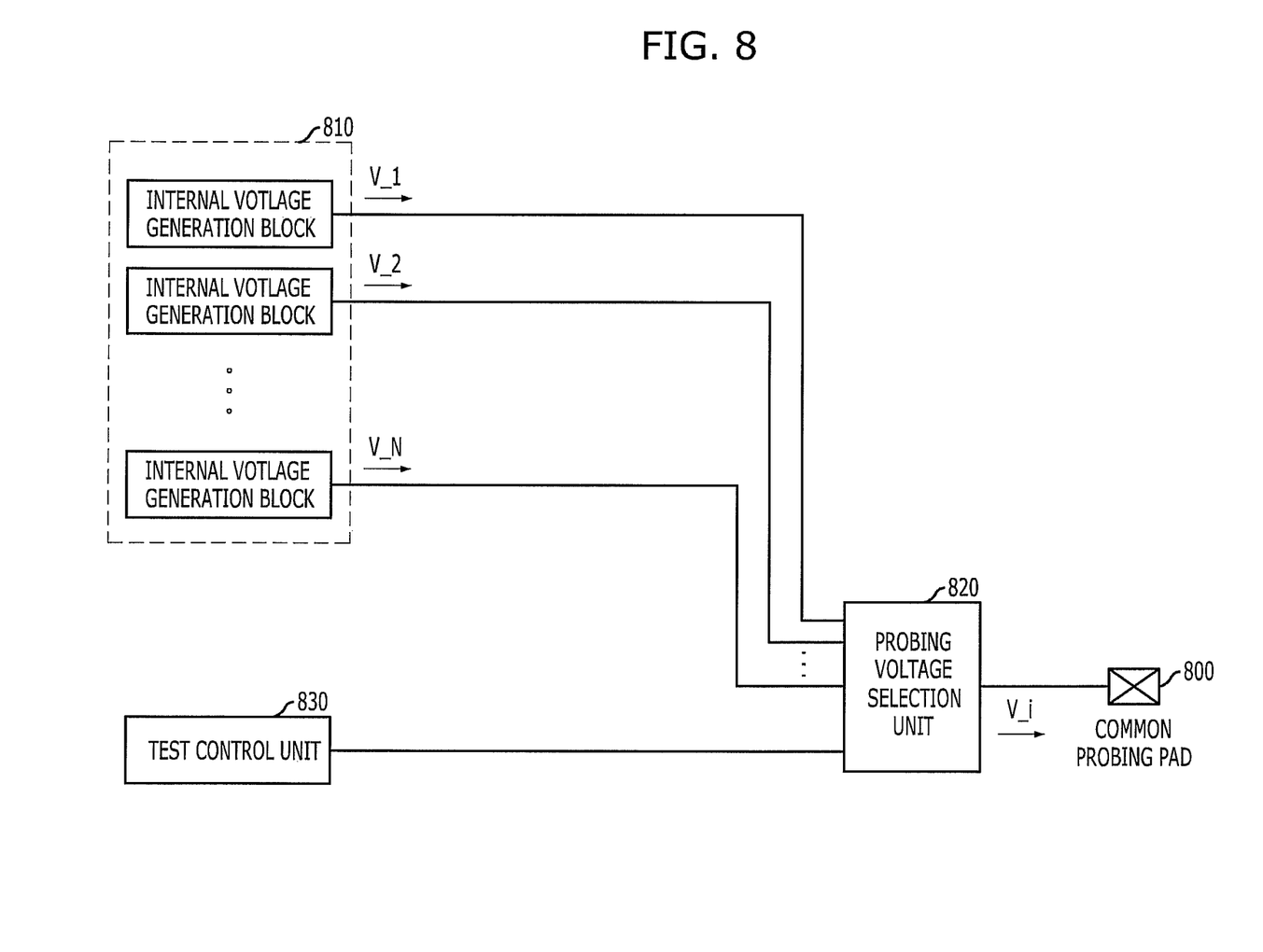
FIG. 8 is a block diagram illustrating a semiconductor device in accordance with another embodiment of the present invention.

FIG. 8 is a block diagram illustrating a semiconductor device in accordance with another embodiment of the present invention.

Referring to FIG. 8, the semiconductor device includes a common probing pad 800, an internal voltage generation unit 810 having a plurality of internal voltage generation blocks, a probing voltage selection unit 820 and a test control unit 830 for generating a plurality of voltage selection signals SEL<1:N>.

The internal voltage generation blocks generate internal voltages V_1 to V_N of a predetermined voltage level, respectively. The internal voltages V_1 to V_N are selectively outputted through the probing voltage selection unit 820.

That is, the probing voltage selection unit 820 transfers a corresponding voltage selected from the internal voltages V_1 to V_N to the common probing pad 800 in response to the voltage selection signals SEL<1:N>. For illustration purposes, the internal voltage outputted from the common probing pad 800 is measured through one channel of the test device.

While the present invention has been described with respect to the specific embodiments, it will be apparent to those skilled in the art that various changes and modifications may be made without departing from the spirit and scope of the invention as defined in the following claims.

For example, an active high or an active low for representing an activation state of a signal or a circuit may be varied in accordance with other embodiments of the present invention.

Especially, the number of interfaces for one channel, the number of voltages for one channel may be changed in accordance with other embodiments of the present invention.

What is claimed is:

1. A semiconductor device, comprising:
a common probing pad;
an internal voltage generation unit having a plurality of internal voltage generation blocks configured to generate a plurality of internal voltages;
a probing voltage selection unit configured to transfer an internal voltage selected from the internal voltages to the common probing pad in response to a plurality of voltage selection signals;
a plurality of power pads configured to receive a plurality of test voltages provided from a test device; and
a forcing-voltage selection unit configured to perform forcing of the test voltages, which are applied to the power pads, to the internal voltage generation blocks in response to the voltage selection signals.

2. The semiconductor device of claim 1, further comprising:
a test control unit configured to generate the voltage selection signals, wherein a same one of the voltage selection signals is configured to be used to control a selective application of one of test voltages provided from a test device to one of the plurality of internal voltage generation blocks and to control a transfer of the internal voltage of the internal voltage generation block to the common probing pad.

3. The semiconductor device of claim 1, wherein the internal voltage generation blocks, respectively, include reference voltage generators configured to generate internal reference voltages and internal voltage generators configured to generate internal voltages corresponding to voltage levels of the internal reference voltages.

4. The semiconductor device of claim 3, wherein the internal voltages are the internal reference voltages generated from the reference voltage generators.

5. The semiconductor device of claim 3, wherein the internal voltages are the internal voltages generated from the internal voltage generators.

6. The semiconductor device of claim 1, further comprising:
a test control unit configured to generate the voltage selection signals.

7. The semiconductor device of claim 1, wherein the internal voltage generation blocks, respectively, include reference voltage generators configured to generate internal reference voltages and internal voltage generators configured to generate internal voltages corresponding to voltage levels of the internal reference voltage.

8. The semiconductor device of claim 7, wherein the forcing-voltage selection unit is configured to perform forcing the test voltages to the reference voltage generators.

9. The semiconductor device of claim 7, wherein the forcing-voltage selection unit is configured to perform forcing the test voltages to the internal voltage generators.

10. The semiconductor device of claim 1, wherein the test voltages are commonly provided to the semiconductor devices through a common voltage channel of the test device.

11. The semiconductor device of claim 1, wherein the probing voltage selection unit includes a plurality of switches configured to output an internal voltage selected from the internal voltages in response to the voltage selection signal.

12. The semiconductor device of claim 11, wherein the switches are transmission gates.

13. The semiconductor device of claim 1, wherein the forcing-voltage selection unit includes a plurality of switches configured to selectively output the test voltages in response to the voltage selection signal.

14. The semiconductor device of claim 13, wherein the switches are transmission gates.

15. A test interface board, comprising:
   a plurality of common voltage input terminals configured to receive a plurality of test voltages provided through a common voltage channel of a test device;
   a plurality of test voltage transferring line group configured to be allocated to a plurality of semiconductor devices, respectively, and to each transfer the test voltages, which are applied to the common voltage input terminals, to the respective semiconductor device; and
   a plurality of voltage transferring pins configured to couple the test voltage transferring line groups to a plurality of power pads of each of the semiconductor devices,
   wherein the plurality test voltages are applied to a plurality of internal voltage generation blocks of each of the semiconductor devices,
   wherein each of the semiconductor devices includes a common probing pad configured to selectively output one of the internal voltages generated from the internal voltage generation blocks.

16. The test interface board of claim 15, wherein the common voltage channel has a plurality of voltage transferring interfaces configured to transfer the test voltages.

17. The test interface board of claim 15, wherein each of the test voltage transferring line groups has a plurality of transfer lines configured to transfer the test voltages.

* * * * *